(12) United States Patent
Zhang et al.

(10) Patent No.: US 12,471,446 B2
(45) Date of Patent: Nov. 11, 2025

(54) DISPLAYING BASE PLATE AND MANUFACTURING METHOD THEREOF, AND DISPLAYING DEVICE

(71) Applicant: BOE Technology Group Co., Ltd., Beijing (CN)

(72) Inventors: Ziyu Zhang, Beijing (CN); Tao Sun, Beijing (CN); Chengjie Qin, Beijing (CN); Pinfan Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/793,980

(22) PCT Filed: Sep. 28, 2021

(86) PCT No.: PCT/CN2021/121357
§ 371 (c)(1),
(2) Date: Jul. 20, 2022

(87) PCT Pub. No.: WO2023/050066
PCT Pub. Date: Apr. 6, 2023

(65) Prior Publication Data
US 2024/0179952 A1    May 30, 2024

(51) Int. Cl.
*H10K 59/12*     (2023.01)
*H10K 59/122*    (2023.01)
(Continued)

(52) U.S. Cl.
CPC ....... *H10K 59/122* (2023.02); *H10K 59/1201* (2023.02); *H10K 59/873* (2023.02); *H10K 2102/311* (2023.02)

(58) Field of Classification Search
CPC ............. H10K 59/122; H10K 59/1201; H10K 59/873; H10K 2102/311
(Continued)

(56) References Cited

U.S. PATENT DOCUMENTS

| 10,879,490 B2 | 12/2020 | Zhang |
| 2005/0032266 A1* | 2/2005 | Suzuki ............. H01L 21/76804 438/50 |

(Continued)

FOREIGN PATENT DOCUMENTS

| CN | 110504291 A | 11/2019 |
| CN | 110634928 A | 12/2019 |

(Continued)

OTHER PUBLICATIONS

Notice of Reasons for Refusal dated Jul. 1, 2025, issued in counterpart JP Application No. 2023-551235, with English translation. (7 pages).

*Primary Examiner* — Dzung Tran
(74) *Attorney, Agent, or Firm* — WHDA, LLP (57) ABSTRACT

A displaying base plate and a manufacturing method thereof, and a displaying device. The displaying base plate includes an opening area and an isolation area surrounding the opening area, the isolation area includes: a first flexible substrate and at least one isolation slot provided on one side of the first flexible substrate, and the isolation slot is formed by a first inorganic film layer, an organic film layer and a second inorganic film layer that are disposed in stack; the first inorganic film layer is disposed close to the first flexible substrate, and the first inorganic film layer has a first surface facing the opening area; the organic film layer is provided on one side of the first inorganic film layer that is away from the first flexible substrate, and the organic film layer has a second surface facing the opening area.

16 Claims, 5 Drawing Sheets

(51) Int. Cl.
  *H10K 59/80*   (2023.01)
  *H10K 102/00*  (2023.01)
(58) Field of Classification Search
  USPC .......................................... 257/40
  See application file for complete search history.

(56) References Cited

U.S. PATENT DOCUMENTS

| | | | |
|---|---|---|---|
| 2016/0190389 A1* | 6/2016 | Lee .................... | H10K 59/8731 |
| | | | 438/28 |
| 2018/0069063 A1* | 3/2018 | Kim ...................... | G02F 1/1343 |
| 2018/0151834 A1* | 5/2018 | Kanaya ............. | H10D 30/6746 |
| 2019/0081273 A1* | 3/2019 | Sung .................. | H10K 59/8731 |
| 2019/0245160 A1* | 8/2019 | Yoon .................... | H10K 50/844 |
| 2020/0152842 A1* | 5/2020 | Park ........................ | H10H 29/10 |
| 2020/0403171 A1 | 12/2020 | Park et al. | |
| 2021/0066625 A1 | 3/2021 | Tian et al. | |

FOREIGN PATENT DOCUMENTS

| | | |
|---|---|---|
| CN | 111162197 A | 5/2020 |
| CN | 111554714 A | 8/2020 |
| CN | 111564482 A | 8/2020 |
| CN | 111755627 A | 10/2020 |
| CN | 112038389 A | 12/2020 |
| CN | 112186023 A | 1/2021 |
| CN | 113241422 A | 8/2021 |
| JP | 2019-050180 A | 3/2019 |
| JP | 2020-194795 A | 12/2020 |

\* cited by examiner

DISPLAYING BASE PLATE AND MANUFACTURING METHOD THEREOF, AND DISPLAYING DEVICE

CROSS-REFERENCE TO RELEVANT APPLICATIONS

The present disclosure is in the national stage of PCT international application to the United States with the PCT number PCT/CN2021/121357 filed on Sep. 28, 2021, and claims the priority of the Chinese patent application before the CNIPA, China National Intellectual Property Administration with the title of "DISPLAYING BASE PLATE AND MANUFACTURING METHOD THEREOF, AND DISPLAYING DEVICE", which is incorporated herein in its entirety by reference.

TECHNICAL FIELD

The present disclosure relates to the technical field of displaying, and more particularly, to a displaying base plate and a manufacturing method thereof, and a displaying device.

BACKGROUND

Organic Light Emitting Diode (OLED) is an active light emitting displaying device, and has advantages such as self-illumination, a wide visual angle, a high contrast, a low power consumption, a wide color gamut, a light weight, a small thickness and easy transformation. With the continuous development of the technique of displaying, the technique of OLED is increasingly applied for flexible displaying. An opening area is usually disposed on the OLED display panel in order to improve the tensile performance of flexible OLED display panels. The opening area can increase the flexibility of the OLED display panels, to realize the effects such as 3D curved-surface adhesion and dynamic small-angle bending.

SUMMARY

The present disclosure provides a displaying base plate, wherein the displaying base plate includes an opening area and an isolation area surrounding the opening area, the isolation area includes: a first flexible substrate and at least one isolation slot provided on one side of the first flexible substrate, and the isolation slot is formed by a first inorganic film layer, an organic film layer and a second inorganic film layer that are disposed in stack;
  the first inorganic film layer is disposed close to the first flexible substrate, and the first inorganic film layer has a first surface facing the opening area;
  the organic film layer is provided on one side of the first inorganic film layer that is away from the first flexible substrate, and the organic film layer has a second surface facing the opening area;
  the second inorganic film layer is provided on one side of the organic film layer that is away from the first flexible substrate, and the second inorganic film layer is provided with a third surface facing the opening area; and
  the second surface is retracted with respect to the first surface and the third surface in a direction away from the opening area, and a surface of the first inorganic film layer that faces the second inorganic film layer and the second surface form the isolation slot.

In an alternative implementation, the at least one isolation slot includes a first isolation slot, the first inorganic film layer forming the first isolation slot includes a first barrier layer, and the organic film layer forming the first isolation slot is a second flexible substrate.

In an alternative implementation, the at least one isolation slot includes a second isolation slot, the organic film layer forming the second isolation slot is a first organic functional layer, and the first organic functional layer includes at least one of: a planarization layer, a pixel definition layer provided on one side of the planarization layer that is away from the first flexible substrate, and a supporting layer provided on one side of the pixel definition layer that is away from the first flexible substrate.

In an alternative implementation, the first organic functional layer is provided with a first groove and a first box dam, the first groove is located on one side of the first box dam that is away from the opening area, and the first groove penetrates the first organic functional layer.

In an alternative implementation, the second inorganic film layer forming the second isolation slot includes a first passivation layer, and an orthographic projection of the first passivation layer on the first flexible substrate covers an orthographic projection of the first box dam on the first flexible substrate.

In an alternative implementation, the first organic functional layer is the planarization layer, and the at least one isolation slot further includes a third isolation slot provided on one side of the second isolation slot that is away from the first flexible substrate;
  the first inorganic film layer forming the third isolation slot is the first passivation layer;
  the organic film layer forming the third isolation slot is a second organic functional layer, and the second organic functional layer includes at least one of: a pixel definition layer provided on one side of the first passivation layer that is away from the first flexible substrate, and a supporting layer provided on one side of the pixel definition layer that is away from the first flexible substrate;
  the second inorganic film layer forming the third isolation slot is a second passivation layer; and
  the second organic functional layer includes a third groove and a third box dam, the third groove is located on one side of the third box dam that is away from the opening area, the third groove penetrates the second organic functional layer, an orthographic projection of the third box dam on the first flexible substrate is located within an area of an orthographic projection of the first box dam on the first flexible substrate, and an orthographic projection of the second passivation layer on the first flexible substrate covers an orthographic projection of the third box dam on the first flexible substrate.

In an alternative implementation, the at least one isolation slot includes a first isolation slot and a second isolation slot, and the second isolation slot is provided on one side of the first isolation slot that is away from the first flexible substrate;
  the first inorganic film layer forming the first isolation slot includes a first barrier layer, the organic film layer forming the first isolation slot is a second flexible substrate, and the second inorganic filmi layer forming the first isolation slot is further used as the first inorganic film layer forming the second isolation slot; and the organic film layer forming the second isolation slot includes a planarization layer, and the second inorganic film layer forming the second isolation slot includes a first passivation layer.

In an alternative implementation, the planarization layer is provided with a second groove and a second box dam, the second groove is located on one side of the second box dam that is away from the opening area, and the second groove penetrates the planarization layer; and
- an orthographic projection of the first passivation layer on the first flexible substrate covers an orthographic projection of the second box dam on the first flexible substrate.

In an alternative implementation, the at least one isolation slot further includes a third isolation slot provided on one side of the second isolation slot that is away from the first flexible substrate;
- the first inorganic film layer forming the third isolation slot is the first passivation layer;
- the organic film layer forming the third isolation slot is a second organic functional layer, and the second organic functional layer includes at least one of: a pixel definition layer provided on one side of the first passivation layer that is away from the first flexible substrate, and a supporting layer provided on one side of the pixel definition layer that is away from the first flexible substrate;
- the second inorganic film layer forming the third isolation slot is a second passivation layer; and
- the second organic functional layer includes a third groove and a third box dam, the third groove is located on one side of the third box dam that is away from the opening area, the third groove penetrates the second organic functional layer, an orthographic projection of the third box dam on the first flexible substrate is located within an area of an orthographic projection of the second box dam on the first flexible substrate, and an orthographic projection of the second passivation layer on the first flexible substrate covers an orthographic projection of the third box dam on the first flexible substrate.

In an alternative implementation, the displaying base plate further includes:
- a luminescent-material layer provided on one side of the at least one isolation slot that is away from the first flexible substrate, wherein the luminescent-material layer is broken inside the isolation slot.

In an alternative implementation, the displaying base plate further includes:
- an encapsulation layer provided on one side of the luminescent-material layer that is away from the first flexible substrate, wherein the encapsulation layer is continuous inside the isolation slot.

In an alternative implementation, the encapsulation layer includes:
- a first inorganic encapsulation film layer provided on the one side of the luminescent-material layer that is away from the first flexible substrate, wherein an orthographic projection of the first inorganic encapsulation film layer on the first flexible substrate covers the opening area and the isolation area;
- a first organic encapsulation film layer provided on one side of the first inorganic encapsulation film layer that is away from the first flexible substrate, wherein an orthographic projection of the first organic encapsulation film layer on the first flexible substrate does not intersect or overlap with the opening area and the isolation area; and
- a second inorganic encapsulation film layer provided on one side of the first organic encapsulation film layer that is away from the first flexible substrate, wherein an orthographic projection of the second inorganic encapsulation film layer on the first flexible substrate covers the opening area and the isolation area.

In an alternative implementation, the encapsulation layer includes:
- a third inorganic encapsulation film layer provided on the one side of the luminescent-material layer that is away from the first flexible substrate, wherein an orthographic projection of the third inorganic encapsulation film layer on the first flexible substrate covers the opening area and the isolation area; and
- a second organic encapsulation film layer provided on one side of the third inorganic encapsulation film layer that is away from the first flexible substrate, wherein an orthographic projection of the second organic encapsulation film layer on the first flexible substrate does not intersect or overlap with the opening area.

In an alternative implementation, a thickness of the organic film layer is greater than or equal to a thickness of the encapsulation layer, and less than or equal to five times the thickness of the encapsulation layer.

In an alternative implementation, a thickness of the encapsulation layer is greater than or equal to 0.5 micrometers, and less than or equal to 3 micrometers.

In an alternative implementation, the isolation slot is of a closed structure surrounding the opening area.

In an alternative implementation, the first surface and the third surface are parallel.

In an alternative implementation, the first flexible substrate has a fourth surface facing the opening area, and the fourth surface is retracted with respect to the first surface in the direction away from the opening area.

In an alternative implementation, a retraction amount of the second surface with respect to the first surface and the third surface is greater than or equal to 0.1 micrometers, and less than or equal to 5.0 micrometers.

The present disclosure provides a displaying device, wherein the displaying device includes the displaying base plate according to any one of the above items.

The present disclosure provides a manufacturing method of a displaying base plate, wherein the displaying base plate includes an opening area and an isolation area surrounding the opening area, and the isolation area is manufactured by:
- providing a first flexible substrate; and
- forming at least one isolation slot on one side of the first flexible substrate, and the isolation slot is formed by a first inorganic film layer, an organic film layer and a second inorganic film layer that are disposed in stack;
- wherein the first inorganic film layer is disposed close to the first flexible substrate, and the first inorganic film layer has a first surface facing the opening area;
- the organic film layer is provided on one side of the first inorganic film layer that is away from the first flexible substrate, and the organic film layer has a second surface facing the opening area;
- the second inorganic filmi layer is provided on one side of the organic film layer that is away from the first flexible substrate, and the second inorganic film layer has a third surface facing the opening area; and
- the second surface is retracted with respect to the first surface and the third surface in a direction away from the opening area, and a surface of the first inorganic film layer that faces the second inorganic film layer and the second surface form the isolation slot.

In an alternative implementation, after the step of forming the at least one isolation slot on the one side of the first flexible substrate, the method further includes:

forming a luminescent-material layer on one side of the at least one isolation slot that is away from the first flexible substrate, wherein the luminescent-material layer is broken inside the isolation slot; and forming a encapsulation layer on one side of the luminescent-material layer that is away from the first flexible substrate, wherein the encapsulation layer is continuous inside the isolation slot.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are embodiments of the present disclosure, and a person skilled in the art can obtain other figures according to these figures without paying creative work. It should be noted that the proportions in the drawings are merely illustrative and do not indicate the actual proportions.

DETAILED DESCRIPTION OF THE EMBODIMENTS

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
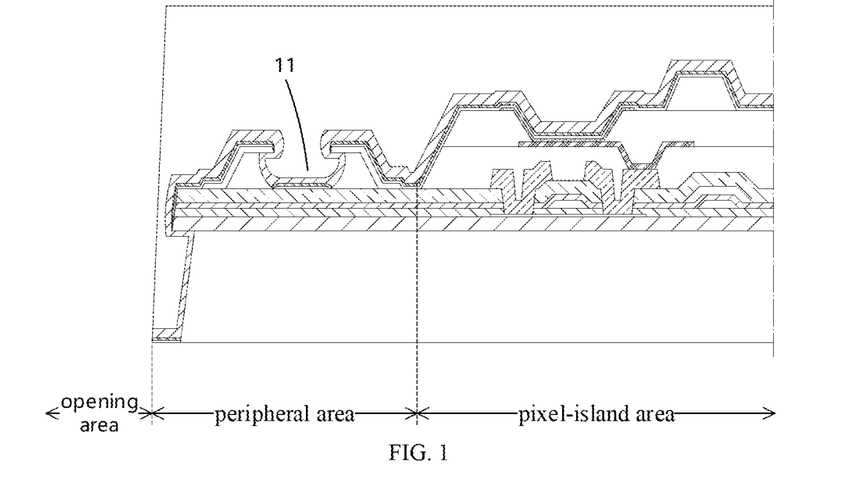
FIG. 1 shows a schematic sectional structural diagram of a displaying base plate in the related art.

In the related art, in order to cut off the invasion path of water and oxygen, as shown in FIG. 1, some isolation components 11 are usually disposed at the periphery area of the opening area. However, the isolation components 11 shown in FIG. 1 highly occupy the space of the periphery area, which is not conducive to improve the pixel density or tensile performance of the displaying base plate.

Figure 2:
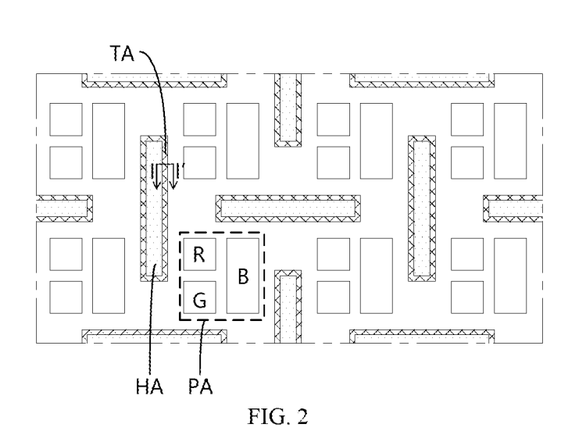
FIG. 2 shows a schematic planar structural diagram of the displaying base plate according to an embodiment of the present disclosure.

In order to solve the above problem, an embodiment of the present disclosure provides a displaying base plate. Referring to FIG. 2, FIG. 2 shows a schematic planar structural diagram of the displaying base plate according to an embodiment of the present disclosure. As shown in FIG. 2, the displaying base plate includes an opening area HA and an isolation area TA surrounding the opening area HA.

As shown in FIG. 2, the displaying base plate may employ an island-bridge structure. The island-bridge structure refers to that the light emitting device is disposed at the pixel island PA, and the pixel island PA may be located on the side of the isolation area TA that is away from the opening area HA. A connecting line is provided at a connecting-bridge area between the pixel islands PA and between the opening areas HA. When an external force is applied to stretch the displaying base plate, the deformation mainly happens at the opening area HA and the connecting-bridge area, and the light emitting device in the pixel island PA maintains an unchanged shape, which can ensure that the light emitting device in the pixel island PA is not destroyed, thereby improving the tensile performance of the displaying base plate.

As shown in FIG. 2, the displaying area of the displaying base plate may include a plurality of the pixel islands PA that are disposed in a matrix, the pixel island PA may include at least one pixel unit, and the pixel units may include sub-pixels such as a red-color sub-pixel R, a green-color sub-pixel G and a blue-color sub-pixel B. The sub-pixels may include a pixel driving circuit and a light emitting device. In an exemplary embodiment, the shape of the sub-pixels may, for example, be rectangular, rhombic, pentagonal or hexagonal. When a pixel unit includes three sub-pixels, the three sub-pixels may be horizontally parallel, vertically parallel or in a triangular arrangement (as shown in FIG. 2). When a pixel unit includes four sub-pixels, the four sub-pixels may be horizontally parallel, vertically parallel or in a square arrangement, which is not limited in the present disclosure.

In the plane perpendicular to the displaying base plate, the substrate and the structural film layers within the opening area HA are totally removed, to form a through-hole structure, or the substrate and the structural film layers within the opening area HA are partially removed, to form a blind-hole structure. In the plane parallel to the displaying base plate, the shape of the stretched hole may include any one or more of an "I" shape, a "T" shape, an "L" shape and a "H" shape, which is not limited in the present disclosure.

Referring to FIGS. 3 to 6, 8 and 9, FIGS. 3 to 6, 8 and 9 show schematic sectional structural diagrams along the position II' in FIG. 2. The displaying base plate at the isolation area TA includes: a first flexible substrate 01 and at least one isolation slot 02 disposed on one side of the first flexible substrate 01, and the isolation slot 02 is formed by a first inorganic film layer 21, an organic film layer 22 and a second inorganic film layer 23 that are disposed in stack.

The first inorganic film layer 21 is disposed close to the first flexible substrate 01, and the first inorganic film layer 21 is provided with a first surface facing the opening area HA. The organic film layer 22 is disposed on the side of the first inorganic film layer 21 that is away from the first flexible substrate 01, and the organic film layer 22 is provided with a second surface facing the opening area HA. The second inorganic film layer 23 is disposed on the side of the organic film layer 22 that is away from the first flexible substrate 01, and the second inorganic film layer 23 is provided with a third surface facing the opening area HA.

The second surface is retracted with respect to the first surface and the third surface in the direction away from the opening area HA, and the surface of the first inorganic film layer 21 that faces the second inorganic film layer 23 and the second surface form the isolation slot 02.

Figure 3:
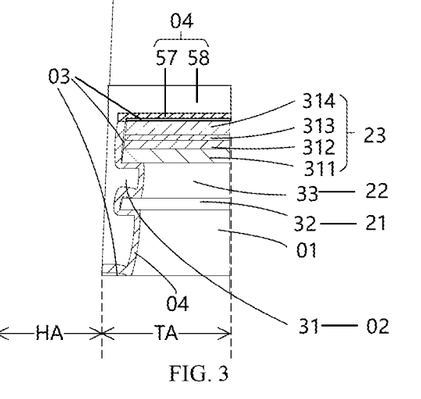
FIG. 3 shows a schematic sectional structural diagram of the first type of the displaying base plate according to an embodiment of the present disclosure.
Figure 4:
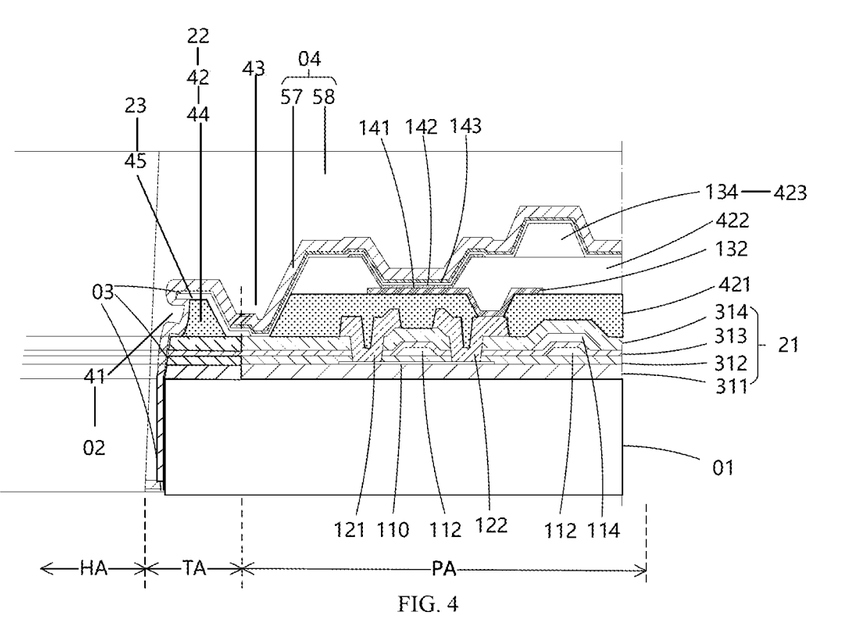
FIG. 4 shows a schematic sectional structural diagram of the second type of the displaying base plate according to an embodiment of the present disclosure.
Figure 5:
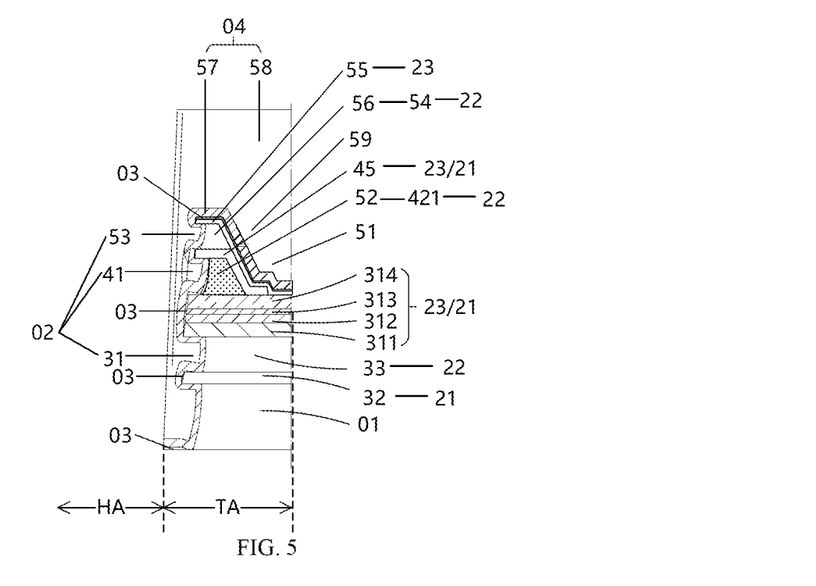
FIG. 5 shows a schematic sectional structural diagram of the third type of the displaying base plate according to an embodiment of the present disclosure.
Figure 6:
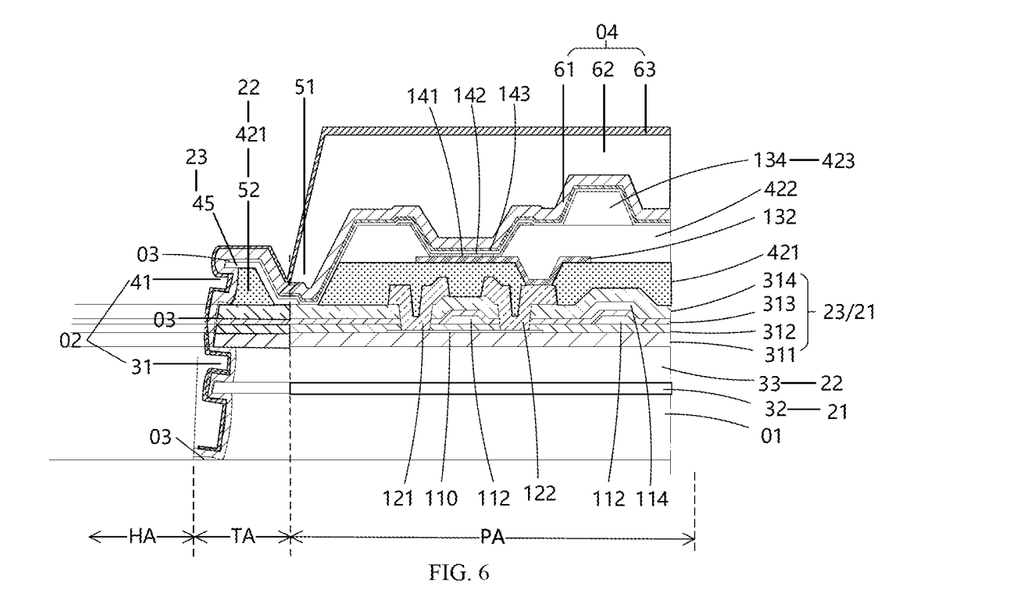
FIG. 6 shows a schematic sectional structural diagram of the fourth type of the displaying base plate according to an embodiment of the present disclosure.
Figure 8:
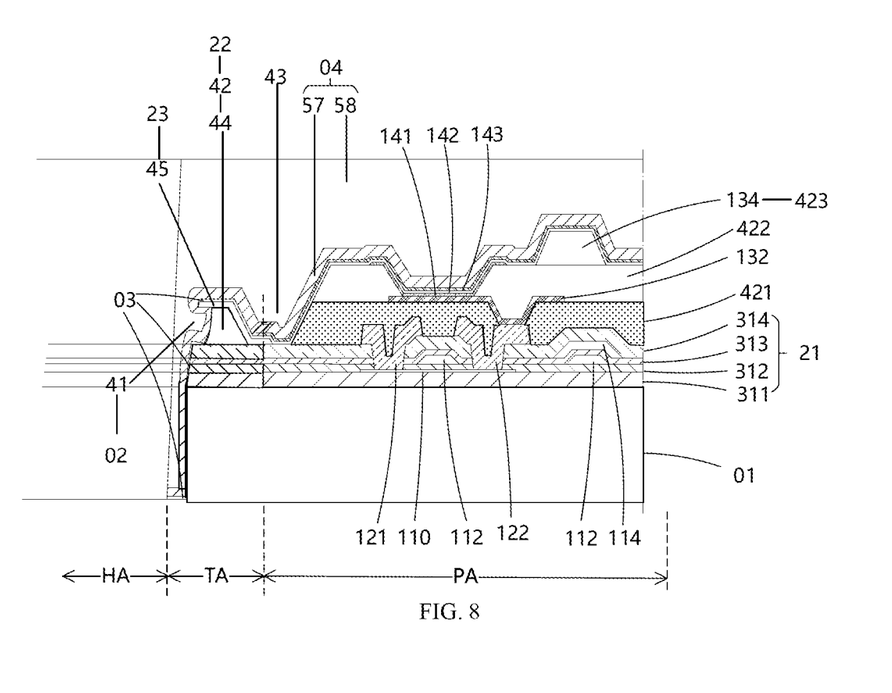
FIG. 8 shows a schematic sectional structural diagram of the fifth type of the displaying base plate according to an embodiment of the present disclosure.
Figure 9:
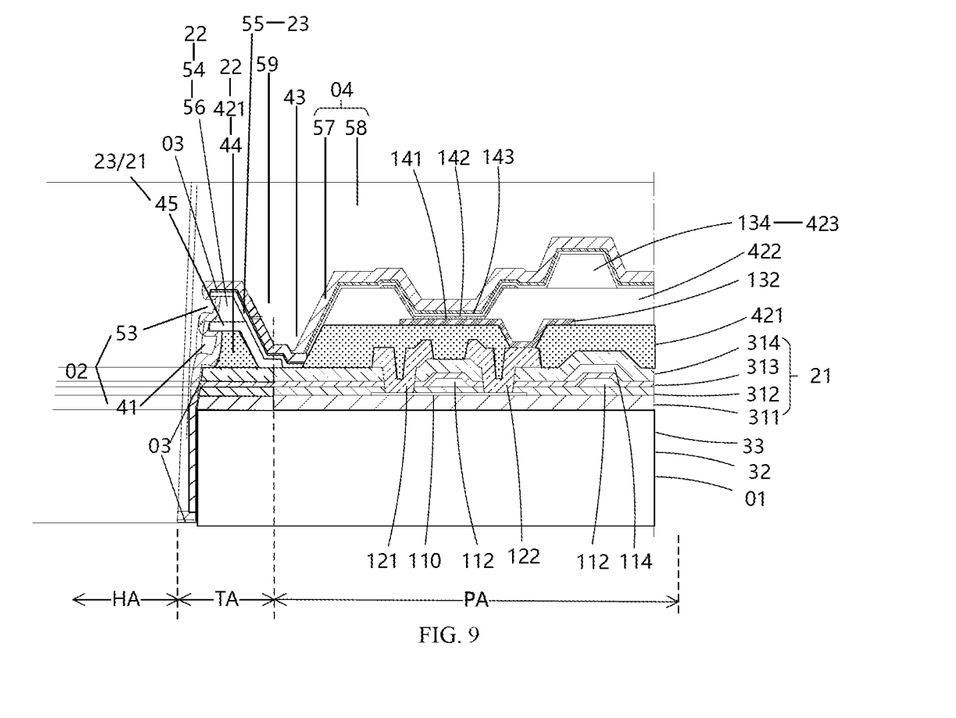
FIG. 9 shows a schematic sectional structural diagram of the sixth type of the displaying base plate according to an embodiment of the present disclosure.

In the present embodiment, the quantity of the isolation slots 02 may be one, as shown in FIGS. 3, 4 and 8, and may also be a plurality, for example three, as shown in FIG. 5, or two, as shown in FIGS. 6 and 9. The quantity of the isolation slots 02 is not limited in the present embodiment.

In the present embodiment, the material of the first flexible substrate 01 may be, for example, a high-temperature-resistant polyimide, which is not limited in the present disclosure. In the manufacturing of the displaying base plate, the lower layer of the first flexible substrate 01 may be provided with a process carrying glass substrate, and, after the displaying base plate is completely manufactured, the first flexible substrate 01 and the glass substrate may be separated by using a laser lift-off (LLO) process.

The material of the first inorganic film layer 21 may include at least one of inorganic materials such as silicon oxide, silicon nitride, aluminum oxide and silicon oxynitride, which is not limited in the present disclosure.

The material of the second inorganic film layer 23 may include at least one of inorganic materials such as silicon oxide, silicon nitride, aluminum oxide and silicon oxynitride, which is not limited in the present disclosure.

The material of the organic film layer 22 may include at least one of organic materials such as polyimide, acrylic and polyethylene terephthalate, which is not limited in the present disclosure.

In a particular implementation, dry etching may be employed, by selecting suitable etching-gas components, realize that the etching speed of the etching gas to the organic film layer 22 is greater than the etching speeds to the first inorganic film layer 21 and the second inorganic film layer 23, thereby forming the isolation slots 02.

In the present embodiment, the isolation slots 02 are located on the surface of the side of the isolation area TA that faces the opening area HA, and the openings of the isolation slots 02 face the opening area HA. In the subsequent vapor deposition of a luminescent-material layer 03, because the isolation slot 02 is located on the side face of the isolation area TA, and therefore the luminescent-material layer 03 is not deposited inside the isolation slot 02 or is deposited at merely some positions, the luminescent-material layer 03 inside the isolation slot 02 is broken. The discontinuous luminescent-material layer 03 may block the invasion channel of water and oxygen between the internal and external of the opening area HA, thereby improving the reliability of the displaying base plate.

The manufacturing process of the encapsulation layer 04 is different from that of the luminescent-material layer 03. The encapsulation layer 04 may completely coat the isolation slot 02, the encapsulation layer 04 is continuous inside the isolation slot 02, and the encapsulation layer 04 may completely coat the fracture surface of the luminescent-material layer, which can prevent invasion of external water and oxygen, thereby further improving the reliability of the displaying base plate.

In the displaying base plate according to the present embodiment, by providing the isolation slot 02 on the side face of the isolation area TA, in an aspect, the reliable encapsulation of a stretchable displaying base plate may be realized. In another aspect, as compared with the solution in which the isolation slot 02 is disposed at the front face of the isolation area TA (as shown in FIG. 1), this solution may reduce the space occupation of the isolation slot 02, and therefore may reduce the size of the isolation area TA. The saved space may be used to increase the size of the opening area HA to improve the tensile performance of the displaying base plate, and may also be used to add the pixel island PA to improve the pixel density of the displaying base plate.

In the present embodiment, the opening area HA and the isolation slot 02 may be synchronously formed, as compared with the structure shown in FIG. 1, it may save one step of a mask process to reduce the process difficulty, and improve the yield.

In the present embodiment, the structure of the isolation slot 02 may be implemented in multiple ways.

In the first alternative implementation, as shown in FIG. 3, the at least one isolation slot 02 includes a first isolation slot 31, the first inorganic film layer 21 forming the first isolation slot 31 includes a first barrier layer 32, and the organic film layer 22 forming the first isolation slot 31 is a second flexible substrate 33.

The second flexible substrate 33 plays a supporting role to displaying base plate, and its material may be the same as or different from the material of the first flexible substrate 01, which is not limited in the present disclosure.

The first barrier layer 32 may be formed by multiple layers of inorganic materials, which is used to block water and oxygen, and it also be used to block diffusion of the laser energy to the interior of the displaying base plate in the subsequent laser lift-off.

In the present implementation, the second inorganic film layer 23 forming the first isolation slot 31 may, for example, include at least one of the following film layers: a second barrier layer 311, a first grid insulating layer 312, a second grid insulating layer 313 and an inter-layer-medium layer 314 that are disposed in stack, which is not limited in the present disclosure.

The second barrier layer 311 may be formed by multiple layers of inorganic materials, which is used to block water and oxygen. All of the first grid insulating layer 312, the second grid insulating layer 313 and the inter-layer-medium layer 314 may be a film layer extending from the pixel island PA to the isolation area TA, and may be formed synchronously with a thin-film transistor in the pixel island PA. The structure of the pixel island PA will be described in the subsequent embodiments.

In the second alternative implementation, as shown in FIGS. 4 and 8, the at least one isolation slot 02 may include a second isolation slot 41, the organic film layer 22 forming the second isolation slot 41 is a first organic functional layer 42, and the first organic functional layer 42 includes at least one of: a planarization layer 421, a pixel definition layer 422 disposed on the side of the planarization layer 421 that is away from the first flexible substrate 01, and a supporting layer 423 disposed on the side of the pixel definition layer 422 that is away from the first flexible substrate 01.

Optionally, as shown in FIG. 4, the first organic functional layer 42 may be the planarization layer 421. The planarization layer 421 is a film layer extending from the pixel island PA to the isolation area TA, and plays a role for planarization in the pixel island PA.

Optionally, as shown in FIG. 8, the first organic functional layer 42 may be the pixel definition layer 422 and the supporting layer 423 that are disposed in stack, and the pixel definition layer 422 and the supporting layer 423 are film layers extending from the pixel island PA to the isolation area TA. The pixel definition layer 422 is used to define the light emitting areas of the sub-pixels in the pixel island PA. The supporting layer 423 includes an isolating column 134 in the pixel island PA, and the isolating column 134 serves to support a vapor-deposition mask.

It should be noted that the first organic functional layer 42 may also be the pixel definition layer 422, may also be the supporting layer 423, may also be the planarization layer 421 and the pixel definition layer 422 that are disposed in stack, and may also be the planarization layer 421 and the supporting layer 423 that are disposed in stack. The first organic functional layer 42 is not particularly limited in the present disclosure.

As shown in FIGS. 4 and 8, the first organic functional layer 42 is provided with a first groove 43 and a first box dam 44, the first groove 43 is located on the side of the first box dam 44 that is away from the opening area HA, and the first groove 43 penetrates the first organic functional layer 42 in a first direction.

The first direction refers to the direction from the surface of the first organic functional layer 42 that is disposed close to the first flexible substrate 01 away from the surface of the first flexible substrate 01. A slot bottom or the second surface of the second isolation slot 41 includes the surface of the side of the first box dam 44 that is disposed close to the opening area HA.

The provision of the first groove 43 and the first box dam 44 on the first organic functional layer 42 may prevent the liquid-state material from overflowing into the opening area HA in the subsequent process flow.

As shown in FIGS. 4 and 8, the second inorganic film layer 23 forming the second isolation slot 41 may include a first passivation layer 45, and the orthographic projection of the first passivation layer 45 on the first flexible substrate 01 covers the orthographic projection of the first box dam 44 on the first flexible substrate 01. Accordingly, the first passivation layer 45 may completely isolate the first organic functional layer 42 and the luminescent-material layer 03 located on its two sides, to prevent water and oxygen from invading the luminescent-material layer 03 via the first organic functional layer 42, thereby improving the reliability of the displaying base plate.

As shown in FIGS. 4 and 8, the first inorganic film layer 21 forming the second isolation slot 41 may, for example, include at least one of the following film layers: a second barrier layer 311, a first grid insulating layer 312, a second grid insulating layer 313 and an inter-layer-medium layer 314 that are disposed in stack.

The second barrier layer 311 may be formed by multiple layers of inorganic materials, which is used to block water and oxygen. All of the first grid insulating layer 312, the second grid insulating layer 313 and the inter-layer-medium layer 314 may be a film layer extending from the pixel island PA to the isolation area TA, and may be formed synchronously with a thin-film transistor in the pixel island PA, as shown in FIGS. 4 and 8.

In the third alternative implementation, as shown in FIG. 9, the at least one isolation slot 02 may further include a third isolation slot 53 disposed on the side of the second isolation slot 41 that is away from the first flexible substrate 01.

The structure of the second isolation slot 41 is the same as the description in the second implementation, and is not discussed herein further. In the present implementation, the organic film layer 22 forming the second isolation slot 41 is the planarization layer 421, as shown in FIG. 9.

The first inorganic film layer 21 forming the third isolation slot 53 is the first passivation layer 45. In other words, the first passivation layer 45 of the second inorganic film layer 23 forming the second isolation slot 41 is re-used as the first inorganic film layer 21 of the third isolation slot 53.

The organic film layer 22 forming the third isolation slot 53 is a second organic functional layer 54, and the second organic functional layer 54 includes at least one of: a pixel definition layer 422 provided on the side of the first passivation layer 45 that is away from the first flexible substrate 01, and a supporting layer 423 provided on the side of the pixel definition layer 422 that is away from the first flexible substrate 01.

The second inorganic film layer 23 forming the third isolation slot 53 is a second passivation layer 55.

The second organic functional layer 54 is provided with a third groove 59 and a third box dam 56, the third groove 59 is located on the side of the third box dam 56 that is away from the opening area HA, the third groove 59 penetrates the second organic functional layer 54, and the orthographic projection of the third box dam 56 on the first flexible substrate 01 is located within the area of the orthographic projection of the first box dam 44 on the first flexible substrate 01. The provision of the third groove 59 and the third box dam 56 may prevent, in the subsequent process flow, the liquid-state material from overflowing into the opening area HA.

The orthographic projection of the second passivation layer 55 on the first flexible substrate 01 covers the orthographic projection of the third box dam 56 on the first flexible substrate 01. Accordingly, the second passivation layer 55 may completely isolate the second organic functional layer 54 and the luminescent-material layer 03 located on its two sides, to prevent water and oxygen from invading the luminescent-material layer 03 via the second organic functional layer 54, thereby improving the reliability of the displaying base plate.

In the fourth alternative implementation, as shown in FIG. 6, the at least one isolation slot 02 includes a first isolation slot 31 and a second isolation slot 41, and the second isolation slot 41 is disposed on the side of the first isolation slot 31 that is away from the first flexible substrate 01.

The first inorganic film layer 21 forming the first isolation slot 31 may include a first barrier layer 32, the organic film layer 22 forming the first isolation slot 31 may be a second flexible substrate 33, and the second inorganic film layer 23 forming the first isolation slot 31 is re-used as the first inorganic film layer 21 forming the second isolation slot 41. In the present implementation, the structure of the film layers forming the first inorganic film layer 21, the organic film layer 22 and the second inorganic film layer 23 of the first isolation slot 31 is the same as the description on the first isolation slot 31 according to the above embodiments, and is not discussed herein further.

The organic film layer 22 forming the second isolation slot 41 includes a planarization layer 421, and the second inorganic film layer 23 forming the second isolation slot 41 includes a first passivation layer 45. Optionally, the planarization layer 421 is provided with a second groove 51 and a second box dam 52, the second groove 51 is located on the side of the second box dam 52 that is away from the opening area HA, and the second groove 51 penetrates the planarization layer 421 in the first direction. The provision of the second groove 51 and the second box dam 52 may prevent the liquid-state material from overflowing into the opening area HA in the subsequent process flow.

The orthographic projection of the first passivation layer 45 on the first flexible substrate 01 covers the orthographic projection of the second box dam 52 on the first flexible substrate 01. Accordingly, the first passivation layer 45 may completely isolate the planarization layer 421 and the luminescent-material layer 03 located on its two sides, to prevent water and oxygen from invading the luminescent-material layer 03 via the planarization layer 421, thereby improving the reliability of the displaying base plate.

A slot bottom or the second surface of the second isolation slot 41 includes the surface of the side of the second box dam 52 that is disposed close to the opening area HA.

As shown in FIG. 5, the at least one isolation slot 02 may further include a third isolation slot 53 disposed on the side of the second isolation slot 41 that is away from the first flexible substrate 01.

The second isolation slot 41 may be located on the side of the first isolation slot 31 that is away from the first flexible substrate 01. The structures of the second isolation slot 41 and the first isolation slot 31 may refer to the above description on FIG. 6, and are not discussed herein further.

The first inorganic film layer 21 forming the third isolation slot 53 is the first passivation layer 45. In other words, the first passivation layer 45 of the second inorganic film layer 23 forming the second isolation slot 41 is re-used as the first inorganic film layer 21 of the third isolation slot 53.

The organic film layer 22 forming the third isolation slot 53 is a second organic functional layer 54, and the second organic functional layer 54 includes at least one of: a pixel definition layer disposed on the side of the first passivation layer 45 that is away from the first flexible substrate 01, and a supporting layer disposed on the side of the pixel definition layer that is away from the first flexible substrate 01.

The second inorganic film layer 23 forming the third isolation slot 53 is a second passivation layer 55.

The second organic functional layer 54 is provided with a third groove 59 and a third box dam 56, the third groove 59 is located on the side of the third box dam 56 that is away from the opening area HA, the third groove 59 penetrates the second organic functional layer 54, and the orthographic projection of the third box dam 56 on the first flexible substrate 01 is located within the area of the orthographic projection of the second box dam 52 on the first flexible substrate 01. The provision of the third groove 59 and the third box dam 56 may prevent the liquid-state material from overflowing into the opening area HA in the subsequent process flow.

The orthographic projection of the second passivation layer 55 on the first flexible substrate 01 covers the orthographic projection of the third box dam 56 on the first flexible substrate 01. Accordingly, the second passivation layer 55 may completely isolate the second organic functional layer 54 and the luminescent-material layer 03 located on its two sides, to prevent water and oxygen from invading the luminescent-material layer 03 via the second organic functional layer 54, thereby improving the reliability of the displaying base plate.

As shown in FIGS. 3 to 6, 8 and 9, the displaying base plate may further include: a luminescent-material layer 03 disposed on the side of the at least one isolation slot 02 that is away from the first flexible substrate 01, wherein the luminescent-material layer 03 is broken inside the isolation slot 02.

The luminescent-material layer 03 may, for example, include one or more of film layers such as a common organic layer, a cathode layer and an optical coupling layer, which is not limited in the present disclosure. The luminescent-material layer 03 may be a film layer extending from the pixel island PA to the isolation area TA.

As shown in FIGS. 3 to 6, 8 and 9, the displaying base plate may further include: a encapsulation layer 04 disposed on the side of the luminescent-material layer 03 that is away from the first flexible substrate 01, wherein the encapsulation layer 04 is continuous inside the isolation slot 02.

In an alternative implementation, as shown in FIG. 6, the encapsulation layer 04 may include:
a first inorganic encapsulation film layer 61 provided on the side of the luminescent-material layer 03 that is away from the first flexible substrate 01, wherein the orthographic projection of the first inorganic encapsulation film layer 61 on the first flexible substrate 01 covers the opening area HA and the isolation area TA;
a first organic encapsulation film layer 62 disposed on the side of the first inorganic encapsulation film layer 61 that is away from the first flexible substrate 01, wherein the orthographic projection of the first organic encapsulation film layer 62 on the first flexible substrate 01 does not intersect or overlap with the opening area HA and the isolation area TA; and
a second inorganic encapsulation film layer 63 disposed on the side of the first organic encapsulation film layer 62 that is away from the first flexible substrate 01, wherein the orthographic projection of the second inorganic encapsulation film layer 63 on the first flexible substrate 01 covers the opening area HA and the isolation area TA.

In the present implementation, the complete wrapping on the opening area HA and the isolation area TA by the first inorganic encapsulation film layer 61 ensures the encapsulation intactness, which effectively isolates the water and oxygen from the opening area HA, and the isolation slot within the isolation area TA forms a nailing point to the encapsulation layer 04, which may further prevent stripping failure at the edge of the film layers.

The first organic encapsulation film layer 62 is disposed on the first inorganic encapsulation film layer, and the first organic encapsulation film layer 62 within the opening area HA and the isolation area TA is removed, to expose the surface of the first inorganic encapsulation film layer 61.

At the areas other than the opening area HA and the isolation area TA, for example, in the pixel island PA, the first inorganic encapsulation film layer 61, the first organic encapsulation film layer 62 and the second inorganic encapsulation film layer 63 are disposed in stack; in other words, the second inorganic encapsulation film layer 63 is provided on the first organic encapsulation film layer 62, to form a stacked structure of an inorganic material/an organic material/an inorganic material. Within the opening area HA and the isolation area TA, the second inorganic encapsulation film layer 63 is disposed on the first inorganic encapsulation film layer 61, to form a stacked structure of an inorganic material/an inorganic material.

The materials of the first inorganic encapsulation film layer 61 and the second inorganic encapsulation film layer 63 may include at least one of inorganic materials such as silicon oxide, silicon nitride, and silicon oxynitride, and they may be a single layer, multiple layers or composite layers, which may ensure that external water and oxygen are not capable of entering the light emitting structural layers.

The material of the first organic encapsulation film layer 62 may be a resin material, which is used to coat all of the film layers of the displaying base plate, which may improve the structural stability and flatness.

In another alternative implementation, as shown in FIGS. 3 to 5, 8 and 9, the encapsulation layer 04 may include:

a third inorganic encapsulation film layer 57 disposed on the side of the luminescent-material layer 03 that is away from the first flexible substrate 01, wherein the orthographic projection of the third inorganic encapsulation film layer 57 on the first flexible substrate 01 covers the opening area HA and the isolation area TA; and a second organic encapsulation film layer 58 disposed on the side of the third inorganic encapsulation filmi layer 57 that is away from the first flexible substrate 01, wherein the orthographic projection of the second organic encapsulation film layer 58 on the first flexible substrate 01 does not intersect or overlap with the opening area HA.

In the present implementation, the complete wrapping on the opening area HA and the isolation area TA by the third inorganic encapsulation film layer 57 ensures the encapsulation intactness, which effectively isolates the water and oxygen from the opening area HA, and the isolation slot within the isolation area TA forms a nailing point to the encapsulation layer 04, which may further prevent stripping failure at the edge of the film layers.

The second organic encapsulation film layer 58 is disposed on the third inorganic encapsulation film layer 57, and the first organic encapsulation film layer within the opening area HA is removed, to expose the surface of the third inorganic encapsulation film layer 57.

Within the areas other than the opening area HA, for example, within the isolation area TA and the pixel island PA, the third inorganic encapsulation film layer 57 and the second organic encapsulation film layer 58 are disposed in stack, to form a stacked structure of an inorganic material/an organic material. Within the opening area HA, the third inorganic encapsulation film layer 57 completely coats.

The material of the third inorganic encapsulation film layer 57 may include at least one of inorganic materials such as silicon oxide, silicon nitride, and silicon oxynitride, and the third inorganic encapsulation film layer 57 may be a single layer, multiple layers or composite layers, which may ensure that external water and oxygen are not capable of entering the light emitting structural layers.

The material of the second organic encapsulation film layer 58 may be a resin material, which is used to coat all of the film layers of the displaying base plate, which may improve the structural stability and flatness.

Optionally, the thickness of the organic film layer 22 is greater than or equal to the thickness of the encapsulation layer 04, and less than or equal to five times the thickness of the encapsulation layer 04. If the thickness of the encapsulation layer 04 is a, then the thickness of the organic film layer 22 may be greater than or equal to a, and less than or equal to 5*a. That may ensure that the encapsulation layer 04 is firm inside the isolation slot 02, and increase the adhesive force of the encapsulation layer 04.

Optionally, the thickness of the encapsulation layer 04 is greater than or equal to 0.5 micrometers, and less than or equal to 3 micrometers, which is not limited in the present disclosure. For example, the thickness of the encapsulation layer 04 may be 1 micrometer, 1.5 micrometers, 2 micrometers and so on, and the particular thickness may be set according to practical demands.

It should be noted that the thickness of a film layer refers to the dimension of the film layer in the first direction.

In order to completely block the invasion paths of the water and oxygen at the peripheries of the opening area HA, the isolation slot 02 may be of a closed structure surrounding the opening area HA.

In an alternative implementation, the first surface and the third surface are parallel. Because the first surface and the third surface are parallel, the first inorganic film layer 21 and the second inorganic film layer 23 may share one mask, which may simplify the process and reduce the cost. Furthermore, the first surface and the third surface are parallel, which may further reduce the size of the isolation area TA, to improve the tensile performance of the displaying base plate or provide space for the pixel density.

In an alternative implementation, the retraction amount of the second surface with respect to the first surface and the third surface is greater than or equal to 0.1 micrometers, and less than or equal to 5.0 micrometers.

Particularly, the retraction amount of the second surface with respect to the first surface may be greater than or equal to 0.3 micrometers, and less than or equal to 1.5 micrometers. The retraction amount of the second surface with respect to the third surface may be greater than or equal to 0.3 micrometers, and less than or equal to 1.5 micrometers. In other words, the slot depth of the isolation slot 02 may be greater than or equal to 0.3 micrometers, and less than or equal to 1.5 micrometers. Optionally, the slot depth of the isolation slot 02 may be greater than or equal to 0.5 micrometers, and less than or equal to 1.5 micrometers.

The process of manufacturing the displaying base plate may include firstly forming the film layers of the displaying base plate on a rigid substrate, and subsequently stripping the displaying base plate from the rigid substrate by using the LLO process. In the process of the laser lift-off, the encapsulation layer 04 within the opening area HA easily cracks, which might result in encapsulation failure.

In order to solve the above problem, in an alternative implementation, referring to FIG. 3, the first flexible substrate 01 is provided with a fourth surface facing the opening area HA, and the fourth surface is retracted with respect to the first surface in the direction away from the opening area HA.

Because the fourth surface is retracted with respect to the first surface, or, in other words, the first surface protrudes with respect to the fourth surface, the first surface serves to block the upward extension of the crack of the encapsulation layer 04 along the side face of the isolation area TA, and the isolation slot 02 extends by avoiding the crack in the encapsulation layer 04 within the opening area, to prevent encapsulation failure, thereby improving the reliability of encapsulation of the displaying base plate.

In a particular implementation, the retraction of the fourth surface with respect to the first surface may be formed synchronously with the isolation slot 02.

The retraction amount of the retraction of the fourth surface with respect to the first surface may be greater than or equal to 0.3 micrometers, and less than or equal to 1.5 micrometers. Optionally, the retraction amount of the retraction of the fourth surface with respect to the first surface may be greater than or equal to 0.5 micrometers, and less than or equal to 1.5 micrometers.

In an alternative implementation, by referring to FIGS. 4, 6, 8 and 9, the pixel island PA includes a pixel circuit disposed on the second barrier layer 311, and a thin-film transistor in the pixel circuit may include a channel material 110, the first grid insulating layer 312, a first grid 112, the second grid insulating layer 313, a second grid 114, the inter-layer-medium layer 314, a source 121 and a drain 122. FIGS. 4, 6, 8 and 9 and the above structure of the thin-film transistor are merely exemplary embodiments, and other stacking structures, bottom-grid structures, bi-grid structures and so on are not limited in the present embodiment.

The planarization layer 421 covers the pixel circuit, and the planarization layer 421 is used for planarization. An anode 132 is connected to a drain 122 by a via hole provided in the planarization layer 421. The pixel definition layer 422 is disposed on the side of the anode 132 that is away from the pixel circuit, the pixel definition layer 422 is disposed with a pixel opening, the material of the pixel definition layer inside the pixel opening is removed, and the pixel opening is used to form an electroluminescent layer of the light emitting device. The position of the pixel opening corresponds to the anode 132, to vapor-deposit the electroluminescent layer 141. A supporting column 134 in the supporting layer 423 is disposed on the side of the non-pixel-opening area of the pixel definition layer 422 that is away from the first flexible substrate 01, to support the vapor-deposition mask in vapor deposition. In an exemplary embodiment, the supporting layer 423 and the pixel definition layer 422 may be formed by using a halftone mask by the same one step of a patterning process, which is not limited in the present disclosure.

The electroluminescent layer 141, a common organic layer 142, a cathode and an optical-regulation layer 143 are provided on the side of the pixel definition layer 422 and the anode 132 that is away from the pixel circuit. The cathode and the optical-regulation layer 143 are provided on the side of the common organic layer 142 that is away from the anode 132. The encapsulation layer 04 is disposed on the side of the cathode and the optical-regulation layer 143 that is away from the anode 132.

The electroluminescent layer 141 and the common organic layer 142 may be deposited by vapor deposition. The common organic layer may, for example, include an electron transporting layer, a hole transporting layer, an electron injection layer, a hole injection layer and so on. The electroluminescent layer 141 may be provided between the electron transporting layer and the hole transporting layer, to realize pixel light emission. The common organic layer is used to increase the luminous efficiency of the luminescent layer. The material of the cathode layer may, for example, be a metal material such as magnesium, silver, aluminum, copper and lithium.

Another embodiment of the present disclosure further provides a displaying device, wherein the displaying device may include the displaying base plate according to any one of the above embodiments.

The pixel structure of the displaying base plate may be an Organic Light Emitting Diode (OLED), a Mini Light Emitting Diode (Mini LED), a Micro Light Emitting Diode (Micro LED), a Quantum-Dot Light Emitting Diode (QLED) and so on.

It should be noted that the displaying device according to the present embodiment may be any products or components that have the function of 2D or 3D displaying, such as a display panel, an electronic paper, a mobile phone, a tablet personal computer, a TV set, a notebook computer, a digital photo frame and a navigator.

Figure 7:
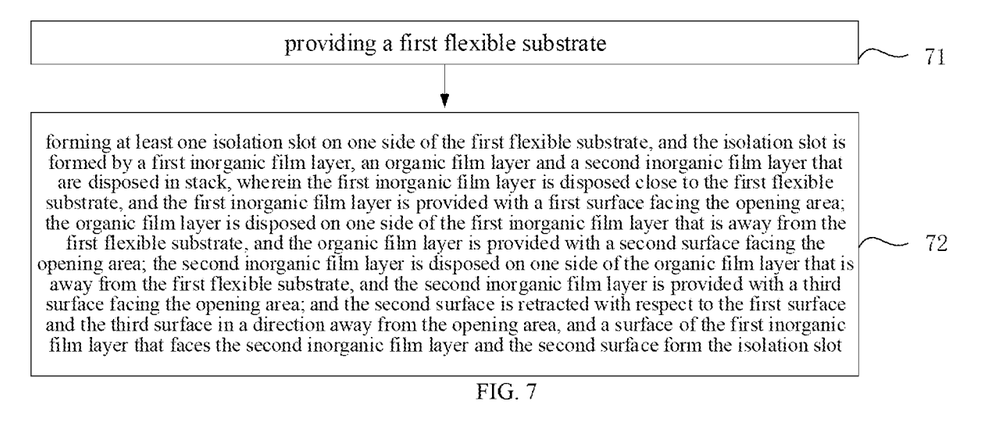
FIG. 7 shows a flow chart of the steps of the manufacturing method of a displaying base plate according to an embodiment of the present disclosure.

Another embodiment of the present disclosure further provides a manufacturing method of a displaying base plate, wherein the displaying base plate includes an opening area and an isolation area surrounding the opening area, and, referring to FIG. 7, the isolation area is manufactured by:

Step 71: providing a first flexible substrate.

Step 72: forming at least one isolation slot on one side of the first flexible substrate, and the isolation slot is formed by a first inorganic film layer, an organic film layer and a second inorganic film layer that are disposed in stack.

The first inorganic film layer is disposed close to the first flexible substrate, and the first inorganic film layer is provided with a first surface facing the opening area; the organic film layer is disposed on one side of the first inorganic film layer that is away from the first flexible substrate, and the organic film layer is provided with a second surface facing the opening area; the second inorganic film layer is disposed on one side of the organic film layer that is away from the first flexible substrate, and the second inorganic film layer is provided with a third surface facing the opening area; and the second surface is retracted with respect to the first surface and the third surface in a direction away from the opening area, and a surface of the first inorganic film layer that faces the second inorganic film layer and the second surface form the isolation slot.

By using the manufacturing method according to the present embodiment, the displaying base plate according to any one of the above embodiments may be obtained.

In an alternative implementation, after the step 72, the method may further include: forming a luminescent-material layer on one side of the at least one isolation slot that is away from the first flexible substrate, wherein the luminescent-material layer is broken inside the isolation slot. After the luminescent-material layer is formed, the method may further include the following steps: forming a encapsulation layer on one side of the luminescent-material layer that is away from the first flexible substrate, wherein the encapsulation layer is continuous inside the isolation slot.

In an alternative implementation, the step 71 may particularly include: providing a first flexible thin film. The step 72 may particularly include the following steps: firstly, by using a film forming process, forming sequentially a first inorganic thin film, an organic thin film and a second inorganic thin film on a side of the first flexible thin film; and subsequently, by using a dry-etching process, treating the first inorganic thin film, the organic thin film, the second inorganic thin film and the first flexible thin film, to synchronously form the opening area, the first flexible substrate located within the isolation area and at least one isolation slot located on a side of the first flexible substrate.

The film forming process may include any one or more of sputtering, vapor deposition and chemical vapor deposition.

The dry-etching process refers to a technique of thin-film etching using plasma. When a gas exists in the form of plasma, there are two characteristics. In an aspect, the gas in the plasma is much more chemically active than that in the normal state. And, according to the difference between the etched materials, by selecting the suitable gas, it may react more quickly with the material, to realize the purpose of etching removal of the thin film. In another aspect, an electric field may be used to guide and accelerate the plasma, to enable it to have a certain energy, and when it bombards the surface of the etched material, it kicks out the atoms of the etched material, thereby realizing the purpose of etching by using physical energy transfer.

In a particular implementation, before the opening area and the isolation slot located at the isolation area are formed by using the dry-etching process, the manufacturing of the anode layer and the pixel definition layer in the pixel island may be completed.

In the present implementation, by configuring the manufacturing of the anode layer and the pixel definition layer before the dry-etching process, influence on the opening area and the isolation slot by the manufacturing process of the anode layer and the pixel definition layer may be prevented.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The A displaying base plate and a fabricating method thereof, and a displaying device according to the present disclosure has been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

A person skilled in the art, after considering the description and implementing the invention disclosed herein, will readily envisage other embodiments of the present disclosure. The present disclosure aims at encompassing any variations, uses or adaptative alternations of the present disclosure, wherein those variations, uses or adaptative alterations follow the general principle of the present disclosure and include common knowledge or common technical means in the art that are not disclosed by the present disclosure. The description and the embodiments are merely deemed as exemplary, and the true scope and spirit of the present disclosure are presented by the following claims.

It should be understood that the present disclosure is not limited to the accurate structure that has been described above and shown in the drawings, and may have various modifications and variations without departing from its scope. The scope of the present disclosure is merely limited by the appended claims.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A displaying base plate, comprising an opening area and an isolation area surrounding the opening area, wherein:
    the isolation area comprises a first flexible substrate and at least one isolation slot disposed on one side of the first flexible substrate, the isolation slot being formed by a first inorganic film layer, an organic film layer and a second inorganic film layer that are stacked;
    the first inorganic film layer is disposed close to the first flexible substrate, and the first inorganic film layer is provided with a first surface facing the opening area;
    the organic film layer is disposed on one side of the first inorganic film layer that is away from the first flexible substrate, and the organic film layer is provided with a second surface facing the opening area;
    the second inorganic film layer is disposed on one side of the organic film layer that is away from the first flexible substrate, and the second inorganic film layer is provided with a third surface facing the opening area;
    the second surface is retracted with respect to the first surface and the third surface in a direction away from the opening area, and a surface of the first inorganic film layer that faces the second inorganic film layer and the second surface form the isolation slot;
    the at least one isolation slot comprises a first isolation slot, the first inorganic film layer forming the first isolation slot comprises a first barrier layer, and the organic film layer forming the first isolation slot is a second flexible substrate; and
    the at least one isolation slot comprises a second isolation slot, the organic film layer forming the second isolation slot is a first organic functional layer, and the first organic functional layer comprises at least one of: a planarization layer, a pixel definition layer disposed on one side of the planarization layer that is away from the first flexible substrate, and a supporting layer disposed on one side of the pixel definition layer that is away from the first flexible substrate.

2. The displaying base plate according to claim 1, wherein the first organic functional layer is provided with a first groove and a first box dam, the first groove is located on one side of the first box dam that is away from the opening area, and the first groove penetrates the first organic functional layer.

3. The displaying base plate according to claim 2, wherein the second inorganic film layer forming the second isolation slot comprises a first passivation layer, and an orthographic projection of the first passivation layer on the first flexible substrate covers an orthographic projection of the first box dam on the first flexible substrate.

4. The displaying base plate according to claim 3, wherein the first organic functional layer is the planarization layer, and the at least one isolation slot further comprises a third isolation slot disposed on one side of the second isolation slot that is away from the first flexible substrate;
the first inorganic film layer forming the third isolation slot is the first passivation layer;
the organic film layer forming the third isolation slot is a second organic functional layer, and the second organic functional layer comprises at least one of: a pixel definition layer disposed on one side of the first passivation layer that is away from the first flexible substrate, and a supporting layer disposed on one side of the pixel definition layer that is away from the first flexible substrate;
the second inorganic film layer forming the third isolation slot is a second passivation layer; and
the second organic functional layer comprises a third groove and a third box dam, the third groove is located on one side of the third box dam that is away from the opening area, the third groove penetrates the second organic functional layer, an orthographic projection of the third box dam on the first flexible substrate is located within an area of an orthographic projection of the first box dam on the first flexible substrate, and an orthographic projection of the second passivation layer on the first flexible substrate covers an orthographic projection of the third box dam on the first flexible substrate.

5. The displaying base plate according to claim 1, wherein the at least one isolation slot comprises a first isolation slot and a second isolation slot, and the second isolation slot is disposed on one side of the first isolation slot that is away from the first flexible substrate;
the first inorganic film layer forming the first isolation slot comprises a first barrier layer, the organic film layer forming the first isolation slot is a second flexible substrate, and the second inorganic film layer forming the first isolation slot is re-used as the first inorganic film layer forming the second isolation slot; and
the organic film layer forming the second isolation slot comprises a planarization layer, and the second inorganic film layer forming the second isolation slot comprises a first passivation layer.

6. The displaying base plate according to claim 5, wherein the planarization layer is provided with a second groove and a second box dam, the second groove is located on one side of the second box dam that is away from the opening area, and the second groove penetrates the planarization layer; and
an orthographic projection of the first passivation layer on the first flexible substrate covers an orthographic projection of the second box dam on the first flexible substrate.

7. The displaying base plate according to claim 6, wherein the at least one isolation slot further comprises a third isolation slot disposed on one side of the second isolation slot that is away from the first flexible substrate;
the first inorganic film layer forming the third isolation slot is the first passivation layer;
the organic film layer forming the third isolation slot is a second organic functional layer, and the second organic functional layer comprises at least one of: a pixel definition layer disposed on one side of the first passivation layer that is away from the first flexible substrate, and a supporting layer disposed on one side of the pixel definition layer that is away from the first flexible substrate;
the second inorganic film layer forming the third isolation slot is a second passivation layer; and
the second organic functional layer comprises a third groove and a third box dam, the third groove is located on one side of the third box dam that is away from the opening area, the third groove penetrates the second organic functional layer, an orthographic projection of the third box dam on the first flexible substrate is located within an area of an orthographic projection of the second box dam on the first flexible substrate, and an orthographic projection of the second passivation layer on the first flexible substrate covers an orthographic projection of the third box dam on the first flexible substrate.

8. The displaying base plate according to claim 1, wherein the displaying base plate further comprises:
a luminescent-material layer disposed on one side of the at least one isolation slot that is away from the first flexible substrate, wherein the luminescent-material layer is broken inside the isolation slot.

9. The displaying base plate according to claim 8, wherein the displaying base plate further comprises:
an encapsulation layer disposed on one side of the luminescent-material layer that is away from the first flexible substrate, wherein the encapsulation layer is continuous inside the isolation slot.

10. The displaying base plate according to claim 9, wherein the encapsulation layer comprises:
a first inorganic encapsulation film layer disposed on the one side of the luminescent-material layer that is away from the first flexible substrate, wherein an orthographic projection of the first inorganic encapsulation film layer on the first flexible substrate covers the opening area and the isolation area;
a first organic encapsulation film layer disposed on one side of the first inorganic encapsulation film layer that is away from the first flexible substrate, wherein an orthographic projection of the first organic encapsulation film layer on the first flexible substrate does not intersect or overlap with the opening area and the isolation area; and
a second inorganic encapsulation film layer provided on one side of the first organic encapsulation film layer that is away from the first flexible substrate, wherein an orthographic projection of the second inorganic encapsulation film layer on the first flexible substrate covers the opening area and the isolation area.

11. The displaying base plate according to claim 9, wherein the encapsulation layer comprises:
a third inorganic encapsulation film layer disposed on the one side of the luminescent-material layer that is away from the first flexible substrate, wherein an orthographic projection of the third inorganic encapsulation film layer on the first flexible substrate covers the opening area and the isolation area; and
a second organic encapsulation film layer disposed on one side of the third inorganic encapsulation film layer that is away from the first flexible substrate, wherein an orthographic projection of the second organic encapsulation film layer on the first flexible substrate does not intersect or overlap with the opening area.

12. The displaying base plate according to claim 1, wherein the isolation slot is of a closed structure surrounding the opening area.

13. The displaying base plate according to claim 1, wherein the first surface and the third surface are parallel.

14. The displaying base plate according to claim 1, wherein the first flexible substrate is provided with a fourth surface facing the opening area, and the fourth surface is retracted with respect to the first surface in the direction away from the opening area.

15. The displaying base plate according to claim 1, wherein a retraction amount of the second surface with respect to the first surface and the third surface is greater than or equal to 0.1 micrometers, and less than or equal to 5.0 micrometers.

16. A displaying device, comprising a displaying base plate, wherein:
the displaying base plate comprises an opening area and an isolation area surrounding the opening area, the isolation area comprises a first flexible substrate and at least one isolation slot disposed on one side of the first flexible substrate, the isolation slot being formed by a first inorganic film layer, an organic film layer and a second inorganic film layer that are stacked;
the first inorganic film layer is disposed close to the first flexible substrate, and the first inorganic film layer is provided with a first surface facing the opening area;
the organic film layer is disposed on one side of the first inorganic film layer that is away from the first flexible substrate, and the organic film layer is provided with a second surface facing the opening area;
the second inorganic film layer is disposed on one side of the organic film layer that is away from the first flexible substrate, and the second inorganic film layer is provided with a third surface facing the opening area;
the second surface is retracted with respect to the first surface and the third surface in a direction away from the opening area, and a surface of the first inorganic film layer that faces the second inorganic film layer and the second surface form the isolation slot;
the at least one isolation slot comprises a first isolation slot, the first inorganic film layer forming the first isolation slot comprises a first barrier layer, and the organic film layer forming the first isolation slot is a second flexible substrate; and
the at least one isolation slot comprises a second isolation slot, the organic film layer forming the second isolation slot is a first organic functional layer, and the first organic functional layer comprises at least one of: a planarization layer, a pixel definition layer disposed on one side of the planarization layer that is away from the first flexible substrate, and a supporting layer disposed on one side of the pixel definition layer that is away from the first flexible substrate.

* * * * *